United States Patent [19]

Damon et al.

[11] Patent Number: 4,894,031

[45] Date of Patent: Jan. 16, 1990

[54] ELECTRONIC SOCKET CARRIER SYSTEM

[75] Inventors: Neil F. Damon, Fort Pierce, Fla.; Ronald E. Senor, North Attleboro, Mass.

[73] Assignee: Augat Inc., Mansfield, Mass.

[21] Appl. No.: 196,038

[22] Filed: May 19, 1988

Related U.S. Application Data

[63] Continuation-in-part of Ser. No. 125,349, Nov. 25, 1987.

[51] Int. Cl.[4] .................................................. H01R 9/24
[52] U.S. Cl. ...................................... 439/885; 29/845; 29/874; 206/329; 206/330; 439/82; 439/876
[58] Field of Search .................................. 439/885–889, 439/876, 891, 81–83; 206/328–330; 29/837, 842, 845, 874, 882, 884

[56] References Cited

U.S. PATENT DOCUMENTS

| | | | |
|---|---|---|---|
| 3,545,606 | 12/1970 | Bennett | 206/56 |
| 3,786,402 | 1/1974 | Horecky | 339/276 A |
| 4,236,776 | 12/1980 | Wellington | 339/17 R |
| 4,296,993 | 10/1981 | Wellington | 339/275 B |
| 4,442,938 | 4/1984 | Murphy | 206/329 |
| 4,466,689 | 8/1984 | Davis et al. | 339/263 R |
| 4,735,575 | 4/1988 | Shaffer | 439/82 |
| 4,752,250 | 6/1988 | Seidler | 29/882 |
| 4,787,510 | 11/1988 | Powell | 206/329 |

*Primary Examiner*—P. Austin Bradley
*Attorney, Agent, or Firm*—Weingarten, Schurgin, Gagnebin & Hayes

[57] ABSTRACT

An electronic socket carrier system in which a plurality of lead sockets are mounted on a thin flexible carrier strip which can be removed from the sockets after mounting on a circuit board. The lead sockets each include retention elements on the socket body to retain the socket on the carrier strip and which can also be employed for locking the socket into a mounting hole of a circuit board. The sockets are cold formed or machined to have a plurality of barbs each with a ramp surface to facilitate installation of the sockets into cooperative holes in the carrier strip, and an edge portion for retaining the socket once installed on the carrier strip.

12 Claims, 4 Drawing Sheets

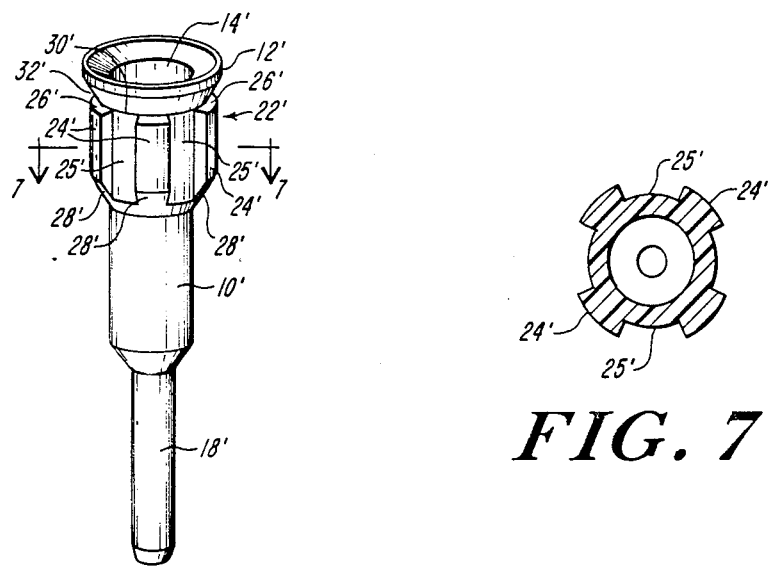
FIG. 6
FIG. 7
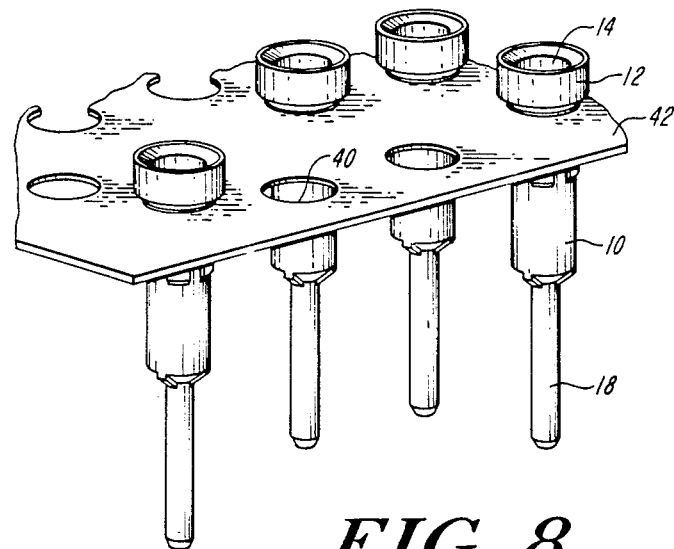
FIG. 8

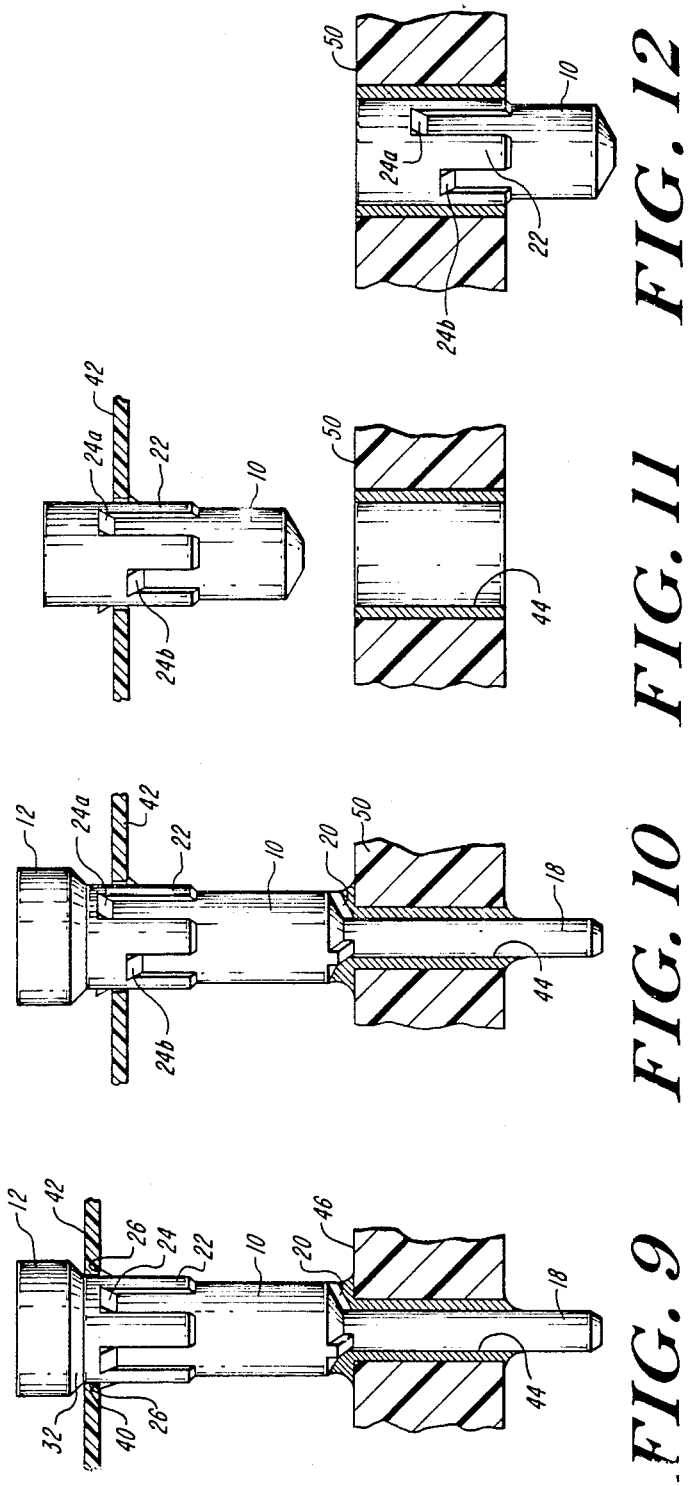

ELECTRONIC SOCKET CARRIER SYSTEM

RELATED APPLICATION

This application is a continuation-in-part of U.S. patent application Ser. No. 125,349, filed Nov. 25, 1987, for "Electronic Socket Carrier System."

FIELD OF THE INVENTION

This invention relates to electronic sockets for receiving the leads of electronic components and more particularly relates to sockets adapted to be removably attached to a flexible carrier for transport and component insertion.

BACKGROUND OF THE INVENTION

Electronic lead sockets are known for use in circuit boards and in socket bodies for receiving the leads of electronic components. The socket in one well-known form comprises a sleeve having an interior cylindrical bore usually with a tapered entry opening at one end and a interconnection pin such as a solder tail or wire-wrapping tail on the opposite end. Contact fingers are provided within the bore of the sleeve and which pluggably receive the leads of a circuit component. The socket is installed in a plated-through opening of the circuit board by press fitting the sleeve into an associated hole with a portion of the sleeve in intimate engagement with the surrounding hole surface to provide mechanical retention of the socket and electrical connection between the plated hole and socket. The sockets are also employed in an array disposed within a body of insulating material to provide a multiple lead socket in a pattern to accept a corresponding lead pattern of an electronic component.

It is also known to mount sockets onto a carrier strip of flexible material by which the sockets can be coiled onto a reel for ease of transport and for use in automatic or semiautomatic assembly machines. One known version of such a carrier strip mounting is shown in U.S. Pat. No. 4,442,938. The socket there shown has a circumferential V-shaped groove provided in the head of the socket adjacent to the entrance opening of the socket, the groove being sized in relation to an opening in a thin carrier strip such that the socket can be snapped into a carrier strip hole and retained on the carrier strip. A plurality of strip-mounted sockets can be installed into cooperative mounting openings of a circuit board and after soldering of the sockets into the board, the flexible strip can be peeled from the soldered sockets.

The dimensions of the circumferential groove must be accurately maintained in relation to the dimensions of the carrier strip hole to provide for suitable retention of the socket on the carrier strip. Loading of the sockets onto the carrier strip is difficult and requires relatively large force to snap the socket through the hole in the strip for seating in the circumferential groove. The formation of the circumferential groove also results in removal of material and thus material waste.

SUMMARY OF THE INVENTION

In accordance with the present invention a lead socket is provided for use with an associated carrier strip and which is fabricated in a relatively inexpensive manner by cold forming, heading or machining procedures to form retention elements on the socket to retain the socket in a carrier strip, and which can also be employed for locking the socket into a mounting hole of a circuit board.

The retention elements may be cold formed by upsetting the socket material with no removal of material during the upsetting process. The cold formed socket is less expensive to fabricate than machined sockets. Moreover, no metal is removed during the fabrication process, thus there is no material waste as there is in machined parts.

Alternatively, the retention elements may be formed by selective machining to remove a predetermined amount of material from selected portions of the socket, thereby providing channels between adjacent retention elements. Machined parts provide an advantage in that there is greater structural integrity in the retention elements.

DESCRIPTION OF THE DRAWINGS

The invention will be more fully understood from the following detailed description taken in conjunction with the accompanying drawings in which:

FIG. 6 is a perspective view of yet a further embodiment of a lead socket according to the present invention;

FIG. 7 is a cross sectional view of the lead socket of FIG. 6 taken along line 7—7;

FIG. 8 is a partially cut-away pictorial view of a plurality of lead sockets of the FIG. 1 embodiment mounted on a carrier strip;

FIG. 9 is an elevation view showing the retention of the socket embodiment of FIG. 1 on a carrier strip and also showing the mounting of the socket in a plated hole;

FIG. 10 is an elevation view of the socket embodiment of FIG. 2 mounted on a carrier strip and installed within a plated hole;

FIG. 11 is an elevation view of the socket embodiment of FIG. 4 mounted on a carrier strip and in position for insertion into a plated hole;

FIG. 12 is an elevation view showing the socket of FIG. 9 after insertion into a plated hole and after removal of the carrier strip.

DETAILED DESCRIPTION OF THE INVENTION

Figure 1:
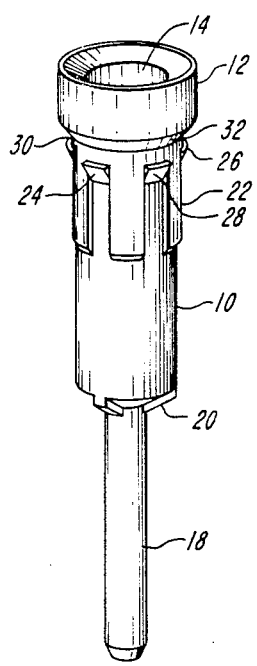
FIG. 1 is a pictorial view of an embodiment of a lead socket in accordance with the invention.
Figure 2A:
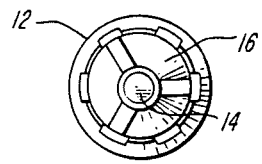
FIG. 2A is a bottom view of the embodiment of FIG. 1.
Figure 2B:
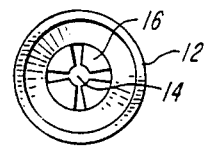
FIG. 2B is a top view of the embodiment of FIG. 1.

A lead socket in accordance with the invention is shown in FIGS. 1 and 2 and includes a sleeve 10 having an enlarged head portion 12 which surrounds an internal bore 14 extending axially into the sleeve and in which a multi-finger contact 16 is disposed for engagement with a component lead inserted therein. A terminal pin 18 axially extends from the sleeve, and a plurality of ribs 20 are circumferentially spaced about the bottom end of the sleeve to serve as standoffs for mounting of the socket onto a circuit board and to provide degassing spaces during soldering of the socket onto the circuit board. This degassing feature is shown in U.S. Pat. Nos. 4,236,776 and 4,296,993, both assigned to the present assignee.

The sleeve 10 includes a portion 22 adjacent to the head portion 12 which is of smaller diameter than the head portion and of greater diameter than that of the lower portion of the sleeve and in which a plurality of barbs 24 are provided. In the illustration of FIG. 1 six barbs 24 are circumferentially egui-spaced and have upper edges 26 which lie on a common circumference.

These barbs are cold formed by plowing in an axial direction along portion 22 toward the head 12 to provide the outwardly extending barbs. Each barb has an upwardly and outwardly extending ramp portion 28 and an upper edge 26. A circumferential area 30 on the surface of portion 22 between the edges 26 of the barbs and a lower beveled edge 32 of the head portion 12 serves as an area for receipt of the carrier strip.

The distance between the edges 26 and the lower end of the head portion is sized in relation to the thickness of the carrier strip to provide a snug fit between the socket and the strip. The diameter of area 30 is also sized in relation to the diameter of the carrier strip hole to provide a snug fit.

The lead sockets are inserted tail first into respective holes 40 of a flexible carrier strip 42 as shown in FIG. 9. As each lead socket is pushed into its hole on the carrier strip, the material expands and deforms sufficiently to permit the carrier strip 42 to be driven over the ramp portions 28 to snap the socket into the strip, with the strip being disposed between the head portion 12 and the confronting edges 26 of the barbs as shown in FIG. 9.

The opening 40 in the carrier strip 42 is merely equal to the diameter of the area 30 of the socket, and smaller than the diameter of the head portion 12 and the diameter of the locus defined by the edges 26 of the barbs 24. The ramped surfaces 28 of the barbs 24 facilitate insertion of the sockets into their respective holes in the carrier strip, while the edges 26 of the barbs serve to retain the sockets on the strip once installed.

In use, the terminal pin 18 of the socket is inserted through a plated hole 44 of a circuit board 46 and is soldered therein as shown in FIG. 9 to secure the socket onto the circuit board. Typically an array of sockets carried on the carrier strip are inserted as a group into a cooperative pattern of plated holes in a circuit board, and all of the sockets are then soldered into place.

Figure 13:
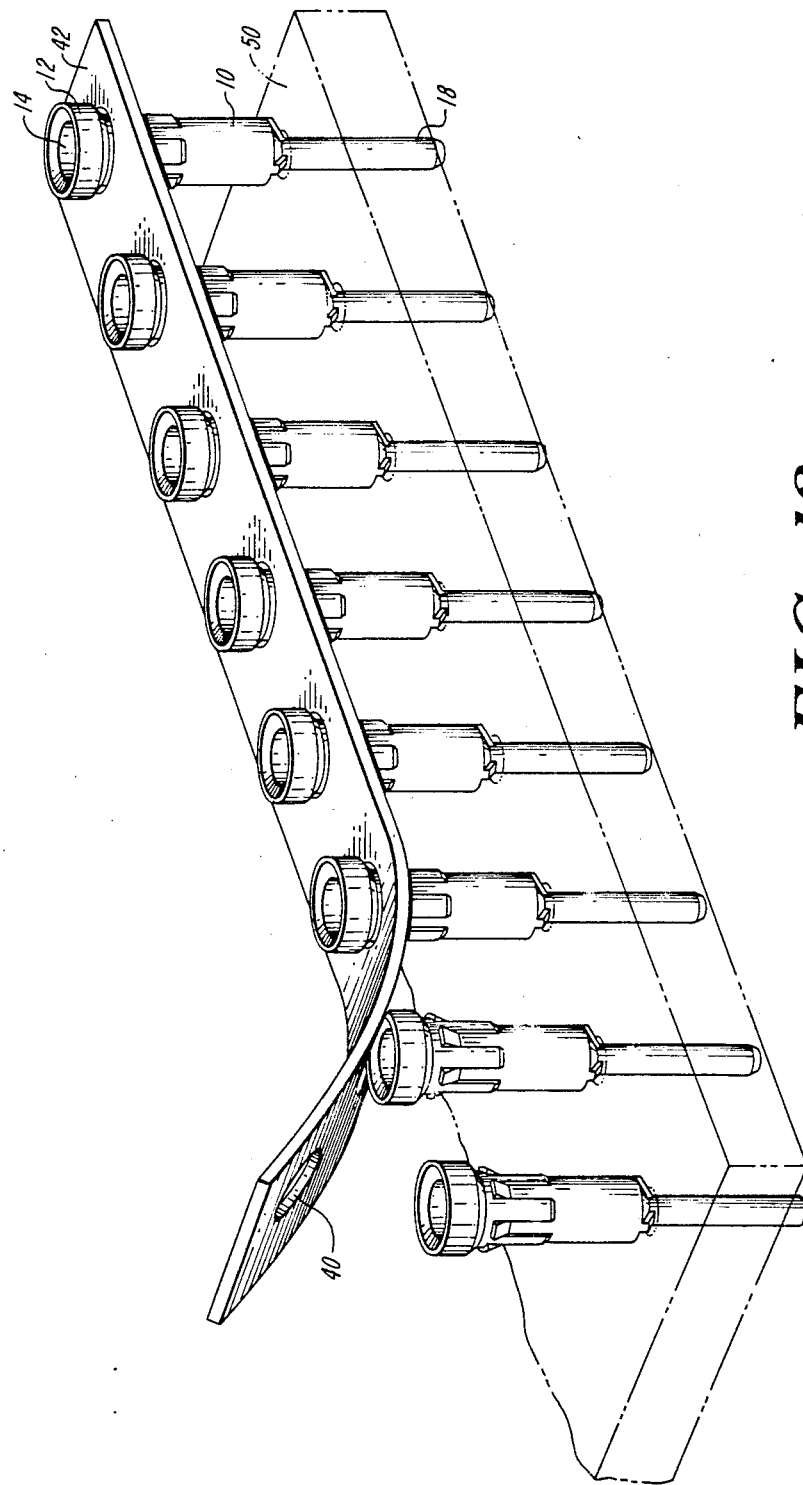
FIG. 13 is an elevation view showing a carrier strip being peeled from mounted sockets.

The carrier strip is then peeled from the sockets after the sockets have been soldered into place by upward pulling of the strip away from the socket heads as shown in FIG. 13. The removal of the carrier strip is aided by the beveled edge 32 provided on the underside of the head 12 confronting the carrier strip.

Figure 3:
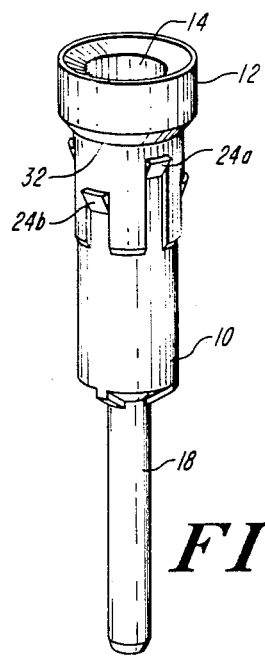
FIG. 3 is a pictorial view of a second embodiment of a lead socket in accordance with the invention.

Another embodiment is shown in FIG. 3 in which the barbs are disposed in two axially spaced planes. In the illustrated embodiment three circumferentially spaced barbs 24a lie in an upper plane, and three circumferentially spaced barbs 24b lie in a lower plane. The lead sockets can be carried on a carrier strip disposed between the head 12 and the upper set of barbs 24a. Alternatively, the carrier strip can be disposed between the upper and lower sets of barbs as shown in FIG. 10.

Figure 4:
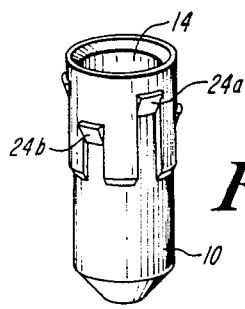
FIG. 4 is a pictorial view of a further embodiment.
Figure 5:
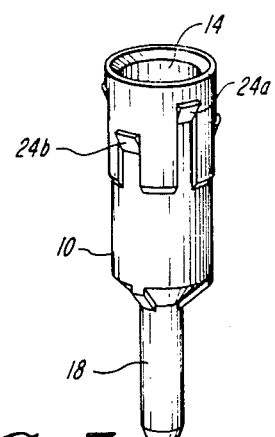
FIG. 5 is a pictorial view of a variation of the embodiment of FIG. 4.

The use of two axially spaced sets of barbs allows the retention of headless sockets on a carrier strip. Headless sockets are depicted in FIGS. 4 and 5. The version of FIG. 4 is configured for insertion within a plated hole of a circuit board. The version of FIG. 5 has a lead 18a for insertion into a plated hole, as described above.

The headless version of FIG. 4 is shown mounted on a carrier strip in FIG. 11 in a position above a plated hole of a circuit board 50. The socket is shown inserted in the plated hole in FIG. 12, with the upper entrance end of the socket substantially flush with the top surface of the circuit board 50. The barbs 24 serve to frictionally engage and bite into the plating of the circuit board mounting hole to retain the socket within the mounting hole. The barbs provide both axial and circumferential retention of the socket in the hole. If desired the headless socket can be soldered into the hole. Preferably, however, the socket is sized in relation to the plated hole to be press fit therein and retained by means of the barbs.

The headless version of the socket shown in FIG. 5 is typically installed with the terminal pin 18 soldered into a mounting opening, as in the embodiments described above. Alternatively, the socket can be press fit and retained within a plated hole by means of the barbs, with the pin 18 outwardly extending from the bottom of the circuit board.

Another embodiment of a lead socket according to the present invention is depicted in FIGS. 6 and 7. The lead socket includes a sleeve 10' having a head portion 12', an internal bore 14', a terminal pin 18' extending axially from the sleeve 10' and a beveled edge 32' contiguous with the head portion 12'.

Part of the sleeve 10' includes a portion 22' adjacent to the head portion 12'. The portion 22' has an outer diameter approximately equal to the outer diameter of the head portion 12'.

A plurality of barbs 24' are formed in the portion 22' by machining the portion 22' to completely remove channels 25' of material. As illustrated more clearly in FIG. 7, the machining process results in the formation of a plurality of barbs 24' which are equally spaced circumferentially about the portion 22'. Each barb 24' has a ramp portion 28' and an upper edge portion 26'.

The lower beveled edge 32' in combination with the upper edges 26' of the plurality of barbs 24' define a circumferential notch portion 30' between the portion 22' and the head portion 12'. The diameter of the notch portion 30' is sized in relation to the diameter of the carrier strip hole of a carrier strip to provide a snug fit therebetween.

The lead socket depicted in FIG. 6 is disposed in the carrier strip 42 in a manner similar to that of the other embodiments. The channels 25' between adjacent barbs 24' permit the material of the carrier strip to deform to compensate for the portions of the material that expand in passing over the outer diameter surfaces of the plurality of barbs 24'. The ramped surfaces 28' facilitate insertion of the lead socket into respective holes in the carrier strip.

The sockets are preferably made of copper which can readily be cold headed. Other suitable materials can also be employed having the requisite mechanical and electrical properties. The socket can alternatively be fabricated by machining, in which case the socket is typically made of brass, with the barbs also being machined. Preferably, the socket is entirely formed by cold heading or cold forming processes. The carrier strip is typically Kapton or Nylon, or other thin flexible material, and typically has a thickness of about 5 mils. The socket in the mounting area is typically about 50 mils in diameter.

The socket carrier system embodying the invention permits easy entry of the sockets onto the carrier strip by the facility of the ramp surfaces on the outwardly extending barbs, and accurate retention of the sockets on the carrier by a single row of barbs and spaced head portion, or by two spaced rows of barbs. The improved carrier system also permits easy removal of the sockets from the carrier after installation of the sockets onto a circuit board.

The invention is not to be limited by what has been particularly shown and described except as indicated in the appended claims.

What is claimed is:

1. An electronic socket carrier system comprising:
    a plurality of lead sockets each including:
    a sleeve having an internal bore and an entrance opening at one end of said sleeve, said entrance opening of said internal bore defining a lead entry to said one end;
    said sleeve including a head portion having a first diameter surrounding said one end;
    a first portion contiguous with said head portion;
    a plurality of circumferentially spaced barbs formed in said first portion by machining said first portion in an axial direction to remove material therefrom to provide outwardly extending barbs circumferentially spaced about said first portion, each barb having an upper edge tapering away from said head portion, and wherein said upper edges of said plurality of circumferentially spaced barbs define a circumferential band;
    a plurality of machined channels formed in said first portion by machining said first portion in the axial direction to remove material therefrom, each of said plurality of channels being formed between adjacent ones of said plurality of circumferentially spaced barbs; and
    a flexible carrier strip having a plurality of holes therethrough, each said hole sized to press-fit receive and releasably retain corresponding ones of said lead sockets, and wherein said circumferential band of upper edges of said barbs of each socket interface with one surface of the flexible carrier strip to retain said lead sockets in said carrier strip.

2. The electronic socket carrier system of claim 1 wherein each of said plurality of barbs includes a ramp portion distal said upper tapered edge thereof to facilitate press-fitting of said lead socket into a corresponding hole of said carrier strip.

3. The electronic socket carrier system of claim 1 wherein said head portion includes a beveled tapered edge distal said one end of said sleeve, and wherein said beveled edge of said head portion and said circumferential band of said upper edges of said barbs define therebetween a notched portion sized to correspond to said holes of said flexible carrier strip.

4. The electronic socket carrier system of claim 1 wherein said first portion has a second diameter, and wherein said second diameter of said first portion is approximately equal to said first diameter of said head portion.

5. The electronic socket carrier system of claim 1 wherein said sleeve further includes a terminal pin actially extending therefrom distal said one end.

6. An electronic socket for mounting in holes of a flexible carrier strip, comprising:
    a metal sleeve having an internal bore and an entrance opening at one end of said sleeve, said entrance opening of said internal bore defining a lead entry at said one end;
    said sleeve including a head portion having a first diameter at said one end thereof:
    said sleeve further including a first portion having a second diameter;
    a transition section between said head portion and said first portion;
    a plurality of circumferentially spaced barbs formed in said first portion by machining thereof in an axial direction to remove material therefrom from one end of said first portion to said transition section;
    a plurality of machined channels formed in said first portion by machining said first portion in the axial direction to remove material therefrom each of said plurality of circumferentially spaced barbs; and
    wherein said electronic socket is configured for releasable mounting in the flexible carrier strip by press fitting said electronic socket into a corresponding mounting hole thereof such that said transition section engages the circumference of the mounting hole and said plurality of circumferentially spaced barbs engages the lower surface of the flexible carrier strip.

7. The electronic socket of claim 6 wherein said first diameter of said head portion is approximately equal to said second diameter of said first portion.

8. The electronic socket of claim 6 wherein said head portion includes a beveled edge portion distal said one end thereof and wherein each of said plurality of barbs includes an upper tapered edge, said tapered edges of said barbs defining a circumferential band, and wherein said beveled edge of said head portion in combination with said circumferential band of said upper tapered edges of said barbs comprise said transition section.

9. The electronic socket of claim 6 wherein each of said plurality of barbs includes an upper edge tapering away from said head portion.

10. The electronic socket of claim 9 wherein each of said plurality of barbs further includes a ramp portion distal said upper tapered edge thereof to facilitate press-fitting of said lead socket into a corresponding mounting hole of said carrier strip.

11. A method of fabricating an electronic socket, comprising the steps of:
    forming a sleeve with an internal bore, a head portion, a first portion contiguous with said head portion and a terminal pin; and
    machining a plurality of channels in said first portion to removing material therefrom to form a plurality of barbs circumferentially equally spaced about said first portion.

12. A method of fabricating an electronic socket, comprising the steps of:
    machining a sleeve with an internal bore, a head portion, a first portion contiguous with said head portion and a terminal pin; and
    machining a plurality of channels in said first portion to remove material therefrom to form a plurality of barbs circumferentially equally spaced about said first portion.

* * * * *

UNITED STATES PATENT AND TRADEMARK OFFICE
CERTIFICATE OF CORRECTION

PATENT NO. : 4,894,031
DATED : January 16, 1990
INVENTOR(S) : Neil F. Damon, et al.

It is certified that error appears in the above-identified patent and that said Letters Patent is hereby corrected as shown below:

Column 3, line 10, "egui-spaced" should read --equi-spaced--.

Column 6, line 20, "plurality of circumferentially" should read --plurality of channels being formed between adjacent ones of said plurality of circumferentially--.

Signed and Sealed this

Third Day of August, 1993

Attest:

MICHAEL K. KIRK

*Attesting Officer*    Acting Commissioner of Patents and Trademarks